(12) United States Patent
Wan et al.

(10) Patent No.: US 9,287,624 B2
(45) Date of Patent: Mar. 15, 2016

(54) ANTENNA CIRCUIT AND A METHOD OF OPTIMISATION THEREOF

(71) Applicant: Hong Kong Applied Science and Technology Research Institute Co. Ltd., New Territories (HK)

(72) Inventors: Tak Ki Wan, Kowloon (HK); Yan Liu, NT (HK); Song He, NT (HK); Dan Yang, NT (HK); Chi Keung Angus Mak, NT (HK)

(73) Assignee: Hong Kong Applied Science and Technology Research Institute Company Limited, Hong Kong (CN)

( * ) Notice: Subject to any disclaimer, the term of this patent is extended or adjusted under 35 U.S.C. 154(b) by 232 days.

(21) Appl. No.: 14/059,444

(22) Filed: Oct. 21, 2013

(65) Prior Publication Data
US 2015/0109176 A1  Apr. 23, 2015

(51) Int. Cl.
G06K 7/10 (2006.01)
H03H 7/46 (2006.01)
H01P 5/18 (2006.01)
H01Q 7/00 (2006.01)
H03H 7/40 (2006.01)
H01Q 1/22 (2006.01)

(52) U.S. Cl.
CPC ............ *H01Q 7/005* (2013.01); *H01Q 1/2216* (2013.01); *H03H 7/40* (2013.01)

(58) Field of Classification Search
CPC ........ H03H 7/40; H01Q 7/005; H01Q 1/2216
USPC ...................................................... 333/17.3
See application file for complete search history.

(56) References Cited

U.S. PATENT DOCUMENTS

| 5,589,844 | A | 12/1996 | Belcher et al. |
| 8,606,198 | B1 * | 12/2013 | Wright ........................ 455/120 |
| 2010/0069011 | A1 | 3/2010 | Carrick et al. |
| 2012/0056795 | A1 | 3/2012 | Nagumo et al. |
| 2012/0258675 | A1 * | 10/2012 | Itkin ........................ 455/115.1 |
| 2013/0241668 | A1 * | 9/2013 | Tokuda et al. ............... 333/109 |

FOREIGN PATENT DOCUMENTS

WO   2013054601 A1   4/2013

OTHER PUBLICATIONS

Sung-Chan Jung; Min-Su Kim; Youngoo Yang; A Reconfigurable Carrier Leakage Canceler for UHF RFID Reader Front-Ends; Jan. 2011 Circuits and Systems I: Regular Papers, IEEE Transactions on (vol. 58 , Issue: 1 ).

* cited by examiner

*Primary Examiner* — Stephen E Jones
*Assistant Examiner* — Scott S Outten
(74) *Attorney, Agent, or Firm* — Eagle IP Limited; Jacqueline C. Lui

(57) ABSTRACT

An antenna circuit is having an impedance circuit which can cancel signal leakage from the input port into the isolation port of a directional coupler. The antenna circuit further comprises a second impedance circuit for optimizing power transfer from the input port to the output port of the directional coupler. Furthermore, the antenna is tunable in order to maximize the reception strength of the antenna. The antenna circuit provides at once the possibility of tuning the antenna strength, optimizing the power transmission and reducing signal jamming by cancelling signal leakage. The antenna finds use as an effective and miniature RFID antenna.

19 Claims, 17 Drawing Sheets

| Situation | Capacitor 1 | Capacitor 2 | Capacitor 3 | Capacitor 4 |
|---|---|---|---|---|
| Free space | 5pF | 10pF | 7pH | 9pF |
| Facing desk | etc | etc | etc | etc |
| Hand holding | etc | etc | etc | etc |
| With fingers | etc | etc | etc | etc |

Figure 8

ANTENNA CIRCUIT AND A METHOD OF OPTIMISATION THEREOF

FIELD OF INVENTION

This invention relates to tunable antennae and, in particular, tunable RFID (radio frequency identity) antenna circuits for use in handheld, portable devices such as mobile telephones.

BACKGROUND OF INVENTION

Although RFID technology is used almost everywhere, its purchase, implementation and access of use are unfortunately limited to buyers of entire, proprietary systems and their permitted users. Organisations which would implement an RFID system are those which have a large number of physical objects to monitor, such as warehouses, libraries, departmental stores and so on. An RFID system implemented in these premises cannot be used by any casual member of the public to locate RFID tagged objects because the member of the public will need a suitable RFID detector and will also need to be given a database to identify objects which are detected by RFID. This causes great inconvenience at a huge cost to the management of these premises because manpower would have to be deployed to help the member of the public to locate tagged objects.

Use of handheld mobile communication devices such as mobile telephones has grown exponentially at the same time as use of RFID systems has. However, the growths of these two sectors are in fact independent and unrelated. Despite the mature state of these two markets and technologies, mobile telephones simply do not come pre-installed with RFID detectors. In the same way, RFID systems are not typically designed to allow any member of the public to use his mobile telephone as an RFID detector.

The mutual independence between these two technologies may be due to several constraints, one of which is the size of an antenna required for sufficiently strong RFID signal transmission and reception at reasonable distance. A handheld mobile communication device tend have a size suitable for being contained in a trouser pocket or to fit into the palm of a user. Therefore, such a device has insufficient space to allow for installation of a relatively bulky but effective RFID antenna. A small antenna cannot be used because the small size causes poor signal isolation and is frequently subject to signal jamming, and is also subjected to undesirable antenna impedance variation due to the 'body effect' of the user. The body effect is when an object in proximity to the antenna creates a sufficiently large change in antenna impedance affecting the efficiency of the antenna in receiving signals.

It is therefore desirable to propose devices and methods which possibly mitigate the constraints of implementing RFID antennae in such handheld mobile communication devices.

SUMMARY OF INVENTION

In a first aspect, the invention proposes an antenna circuit comprising: a directional coupler having an input port, isolation port and an output port; a first impedance circuit suitable for connecting the output port and an antenna; the first impedance circuit being tunable and having a first initialisation tuning to provide a initialisation impedance to reflect signal from the output port back to the output port to substantively cancel signal leaking from the input port into the isolation port; wherein the first impedance circuit is tunable from the initialisation tuning to adjust the impedance to substantively cancel signal un-cancelled at the first initialisation impedance.

By the terminology of "antenna circuit", the skilled reader knows it does not refer here only to a very antenna itself but include accompanying full or partial circuitry for improving, modifying or controlling transmission and reception of signals to and from the antenna.

RFID signals reflected from an RFID tag in an environment tend to be very small in magnitude. Signal jamming is caused when the signal leakage from the input port into the isolation port is big enough to mask any signal reflected from an RFID tag. The invention provides the possibility of using transmission signal reflected at the output port in a suitable magnitude and phase, to cancel the signal leakage in the isolation port, thereby suppressing signal jamming and providing good transmission and reception signal isolation.

Reducing the leakage signal allows the antenna to be small while having the efficiency of a relatively bulkier antenna. Accordingly, the invention also provides the possibility that a palm-size mobile telephone may be installed with a small antenna in order for the mobile telephone to be used as an RFID detector with reasonably long read distance, without affecting the size of the mobile telephone.

Preferably, the first initialisation impedance is determined from characteristics of the directional coupler to provide a reflection coefficient based on:

$$\Gamma_A = \frac{-I}{CT}$$

where,
$\Gamma_A$ is the reflection coefficient between the output port and the first impedance circuit;
T refers to insertion loss from the input port to the output port;
C refers to factor of coupling between the input port and the couple port;
I refers to isolation between the input port and the isolation port.

The values of I, C and T are characteristic of each directional coupler and are provided by the manufacturer of the directional coupler, or may be obtained easily by testing and analysing the directional coupler. These values may be used to calculate how much leakage signal characteristically flows from the input port into the isolation port.

Therefore, impedance can be determined such that it provides a reflection coefficient that reflects a signal of a suitable magnitude and phase for preferably complete, but possibly partial, cancellation of the leakage.

The first initialisation tuning typically comprises a set of settings or values for the variable components in the first impedance circuit, which is saved in a memory accessible to the antenna circuit, which can be loaded into the variable components. The memory can be in an EEPROM, removable memory stick or even a remotely located memory accessible wireless or remotely. Alternatively, it is also possible that the tunable components are physically pre-set to the first initialisation settings, such as by setting flags.

Preferably, the antenna circuit further comprises a controller programmed to tune the first impedance circuit starting from the first initialisation tuning, to optimise cancellation of the signal un-cancelled at the first initialisation impedance.

The controller may be a micro-controller, a processor or even a remote computing device for controlling the antenna circuit. By 'programmed', the skilled reader will understand that the controller runs on a program, a software, a firmware or any microcontroller program for directing the controller to perform tasks.

When the antenna is subjected to an external effect such as body effect, the impedance at the antenna will change, affecting the combined and overall impedance of the antenna and the first impedance circuit. This changes the amount of transmission signal reflected into the output port. Any resulting insufficient cancellation of leakage signal can be detected at the isolation port. The first impedance circuit may then be fine-tuned to increase or decrease the impedance to re-optimise signal cancellation. Re-optimisation of the cancellation is likely to be achieved at a new impedance near the initialisation impedance. Thus, fine-tuning the first impedance circuit starting from the initialisation impedance relieves the need of sweeping through an entire range of impedance. The initialisation impedance may be fine-tuned incrementally or decrementally, which may be determined as the case require.

Preferably, the antenna circuit comprises a second impedance circuit suitable for connecting the input port and a power supply output port; the second impedance circuit being tunable and having a second initialisation tuning to provide a second initialisation impedance to match the impedance of the input port; wherein the second impedance circuit is tunable from the second initialisation tuning to adjust the impedance to substantively match a change in the impedance of the input port.

Any change in the antenna impedance load due to the presence of objects in proximity to the antenna may cause a change in the overall combined impedance of the antenna, the first impedance circuit and the directional coupler. Re-matching the impedance of the second impedance circuit to the change impedance of the input port will re-optimise signal transfer into the input port.

Typically, the second initialisation impedance is determined from characteristics of the directional coupler to provide a reflection coefficient based on:

$$\Gamma_{PA} = \left(\frac{-IT}{C}\right)^*$$

where * means the conjugate; and
$\Gamma_{PA}$ is the reflection coefficient between the input port and the second impedance circuit.

As with the first impedance circuit, the initialisation tune setting typically comprises a set of settings or values which is saved in a memory accessible to the antenna circuit, which can be loaded into variable or tunable components in the second impedance circuit. The memory can be in an EEPROM, removable memory stick or even a remotely located memory accessible wireless or remotely. However, it is also possible that the components are physically pre-set to the initialisation settings.

Preferably, the same controller or another controller is also programmed to tune the second impedance circuit starting from the second initialisation tuning, to optimally match the change in the impedance of the input port.

Re-matching of impedance change in the input port is likely to be achieved at a new impedance near the initialisation impedance. Thus, fine-tuning the second impedance circuit starting from the initialisation impedance relieves the need of sweeping through an entire range of impedance to re-optimise the antenna circuit. The initialisation impedance may be fine-tuned incrementally or decrementally, which may be determined as the case requires.

Optionally, the antenna itself is also tunable and therefore may be optimised for signal transmission and reception from the surroundings.

Preferably, the antenna circuit has access to memory containing at least one set of pre-determined optimisation values for the antenna. The access may include wireless access to a remote memory, and direct access to a physically connected memory. The at least one set of pre-determined optimisation values may be obtained in factory setting under simulation of real use situations, such as by placing the antenna in a handheld device which is held in a person's hand, which is in free space, behind a desk and so on. These simulations were selected from the most likely situations a handheld device may be found in.

In a second aspect, the invention proposes a handheld communication device comprising: an RFID antenna circuit having a directional coupler having an input port, a output port and an isolation port; an impedance load connected the output port; wherein the impedance load provides an impedance to reflect signal output from the output port back to the output port to substantively cancel signal leaking from the input port into the isolation port. Embodiments having this aspect only addresses signal jamming due to large magnitude signal leakage into the isolation port.

In a third aspect, the invention proposes a handheld communication device comprising: an RFID antenna circuit having a directional coupler having an input port, a output port and an isolation port; an impedance load suitable for connecting a power supply output port and the input port; wherein the impedance load provides an impedance matching the impedance of the input port for substantively optimising power transmission from the impedance load to the input port. Embodiments having this aspect only addresses poor signal transmission into the input port due to impedance mismatch between the power supply and the input port.

The handheld communication device may be a mobile telephone, a personal digital assistant (PDA), a notebook computer, a tablet computer such as the iPad™ and so on, and the antenna is used to detect RFID tagged objects. Typically, the handheld communication device is a mobile telephone. Accordingly, uses of mobile phones may now be downloaded with RFID tag libraries provided by owners of premises, and use the RFID antenna circuit in the mobile phones to detect RFID tagged objects in a warehouse or departmental store themselves without need to obtain help from manpower deployed by the owners of the premises.

In a fourth aspect, the invention proposes an RFID antenna circuit having a directional coupler having an input port, a output port and an isolation port; an impedance load suitable for connecting a power supply output port and the input port; wherein the impedance load provides an impedance matching the impedance of the input port for substantively optimising power transmission from the impedance load to the input port.

Therefore, the directional coupler may be prepared and sold independently along with an impedance load to provide a signal reflection coefficient at the output port of the directional coupler to cancel any leakage from the input port into the isolation port, without an antenna pre-attached. In use, it is preferable that the signal leakage into the isolation port is perfectly cancelled although this does not necessarily have to be the case as impedance change in the antenna will affect the amount of the signal cancelled. Even if the impedance load provides a fixed, un-tunable impedance based on I, C and T of the directional coupler, the performance of the directional coupler will be improved under general situations, since the theoretical amount of signal leakage into the isolation port is largely or substantively cancelled. The downside of providing a fixed, un-tunable impedance is that the directional coupler cannot address change in the amount of leakage signal cancelled due to change in impedance in the antenna.

In a fifth aspect, the invention proposes a directional coupler circuit comprising: a directional coupler having an input port, a output port, and an isolation port; an impedance load connected to the output port; the impedance load being suitable for providing an impedance to reflect signal output from the output port back to the output port to substantively cancel signal leaking from the input port into the isolation port.

The impedance load may be a circuit with a fixed impedance incapable of being tuned, although a tunable one is preferred. Even if the impedance load provides a fixed, un-tunable impedance based on I, C and T of the directional coupler, the performance of the directional coupler will be improved under general situations, since the theoretical amount of signal leakage into the isolation port is largely or substantively cancelled. The downside of providing a fixed, un-tunable impedance is that the directional coupler cannot address deterioration in leakage signal cancellation due to change in impedance in the antenna.

In a sixth aspect, the invention proposes a directional coupler having an input port, a output port and an isolation port; an impedance load connected to the input port; the impedance load being suitable for connecting to a power supply output port; wherein the impedance load is suitable for providing an impedance matching the impedance of the input port to substantively optimise power transmission from the power supply output port to the input port.

The impedance load may be a circuit with a fixed impedance incapable of being tuned, although a tunable one is preferred. Even if the impedance load provides a fixed, un-tunable impedance based on I, C and T of the directional coupler, the performance of the directional coupler will be improved under general situations, since the theoretical amount of signal transmission into the input port is largely or substantively optimised. The downside of providing a fixed, un-tunable impedance is that the directional coupler cannot address deterioration in signal transmission due to change in impedance in the antenna.

In a seventh aspect, the invention proposes a method of optimising an antenna circuit, comprising the steps of: providing a directional coupler having an input port, output port and isolation port, the output port being suitable for feeding signal to an antenna; providing a first impedance load at the output port of the directional coupler to reflect at least a portion of signal output at the output port back into the output port to substantively cancel a signal leaking from the input port into the isolation port.

In this case, the first impedance load may be tunable or not. Preferably, however, the first impedance load is tunable and has a first initialisation impedance; the method further comprising a step of: starting from the first initialisation impedance, tuning the impedance of the first impedance load to cancel signal un-cancelled at the first initialisation impedance.

Therefore, if the controller detects possible deterioration in leakage cancellation, such as by body effect of the user, impedance at the output port can be re-tuned to optimise cancellation of the leakage starting from the first initialisation impedance. The invention provides the possibility of quicker optimisation than to sweep the available range of impedance since the re-tuned impedance is likely to be near the first initialisation impedance.

Typically, the first initialisation impedance is determined from characteristics of the directional coupler to provide a reflection coefficient based on:

$$\Gamma_A = \frac{-I}{CT}$$

where, $\Gamma_A$ is the reflection coefficient between the output port and the first impedance circuit;

T refers to insertion loss from the input port to the output port;

C refers to factor of coupling between the input port and the couple port;

I refers to isolation between the input port and the isolation port.

Preferably, the antenna circuit further comprises a step of: providing a second impedance load having an impedance to substantively match the impedance of the input port.

Preferably, the second impedance load is tunable and has a second initialisation impedance; the method further comprising a step of: starting from the second initialisation impedance, tuning the impedance of the second impedance load to substantively match a change in the impedance of the input port. In other words, the method further comprises a step of, starting from the second initialisation impedance, tuning the impedance of the second impedance load to optimise power transfer from the impedance load to the input port.

Therefore, if the controller detects a possible deterioration in optimal signal transmission, it is possibly quicker to re-tuned or re-optimised starting from the second initialisation impedance than to sweep the available range of impedance.

Typically, the second initialisation impedance is determined from characteristics of the directional coupler to provide a reflection coefficient based on:

$$\Gamma_{PA} = \left(\frac{-IT}{C}\right)^*$$

where * means the conjugate; and $\Gamma_{PA}$ is the reflection coefficient between the input port and the second impedance load.

Preferably, the antenna is a tunable antenna, and the method further comprises setting an initialisation value for at least one tunable components in the tunable antenna, tuning the at least one tunable components in the tunable antenna from the initialisation value to obtain optimal reception of RFID signals. Thus, when the controller detects deterioration in the tunable antenna's reception of RFID signals, it is possible that the antenna can be reset to the initialisation value first before the first impedance circuit and second impedance circuit are tuned to be re-optimised.

Preferably, the method further comprises selecting an initialisation value for the at least one tunable component in the tunable antenna from a plurality of pre-determined initialisation values. The plurality of pre-determined initialisation values may be determined for a few common situations in which the tunable antenna may be found. For example, a device containing the tunable antenna placed in free space, cradled in the palm of a person, held by the person's fingers or placed behind a desk. Having a plurality of initialisation values allows the antenna to be jump-tuned from one of these initialisation values to another. Once the initialisation value which gives the best antenna reception is found and chosen from the plurality of pre-determined initialisation values, the controller can start sweeping or fine-tuning the value of the variable component starting from the chosen initialisation value. This optimises the antenna reception even more. The controller may fine-tune the value in the variable component incrementally or decrementally, as the case may require.

BRIEF DESCRIPTION OF FIGURES

Non-limiting, exemplary embodiments of the invention will now be described with reference to the following drawings, in which like reference number refers to like parts, wherein

FIG. 8 is a lookup table used in the RFID antenna circuit of FIG. 6;

DETAILED DESCRIPTION OF THE PREFERRED EMBODIMENTS

Figure 1:
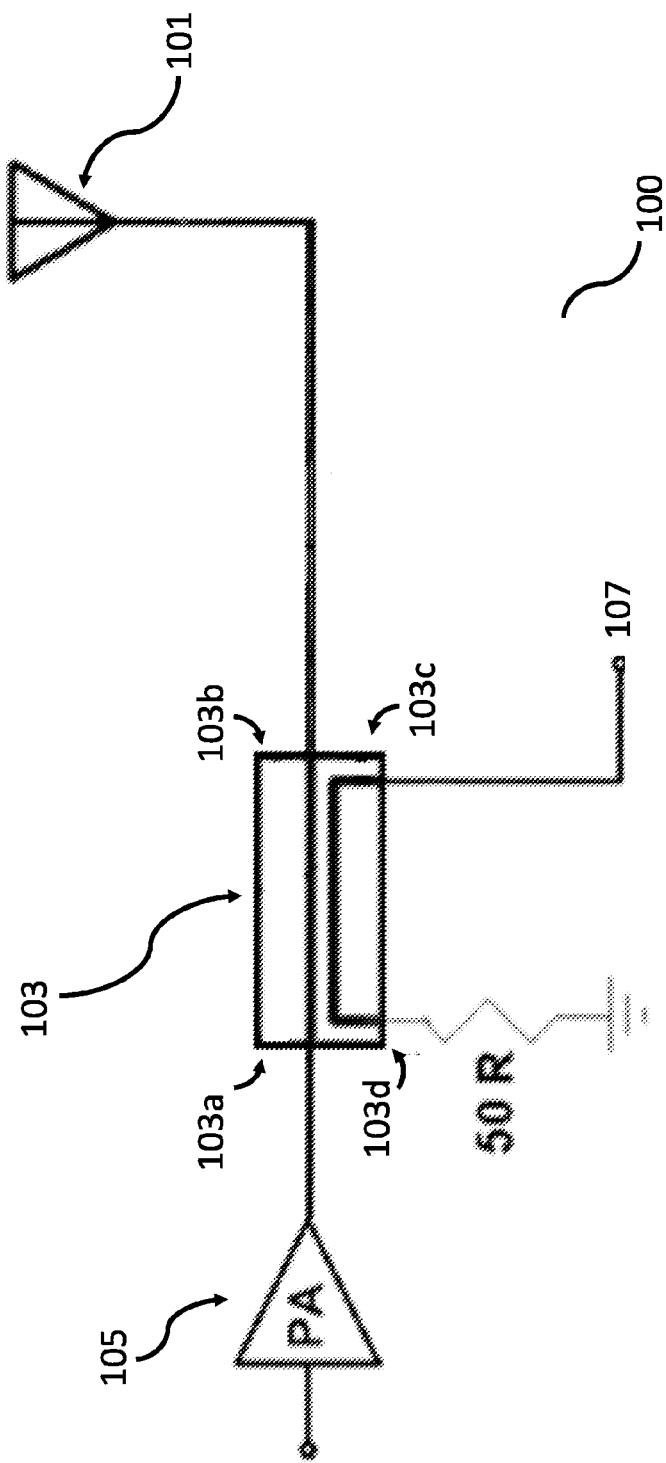
FIG. 1 illustrates an RFID antenna circuit.

FIG. 1 shows an RFID antenna circuit 100 comprising an antenna 101 for sending out probing signals into the surroundings. Any RFID tag in the vicinity will reflect the signal back to the antenna 101 for identification. The antenna 101 is connected to a directional coupler 103 to isolate probing signals broadcasted from the antenna from reflected signals received by the antenna.

Figure 2:
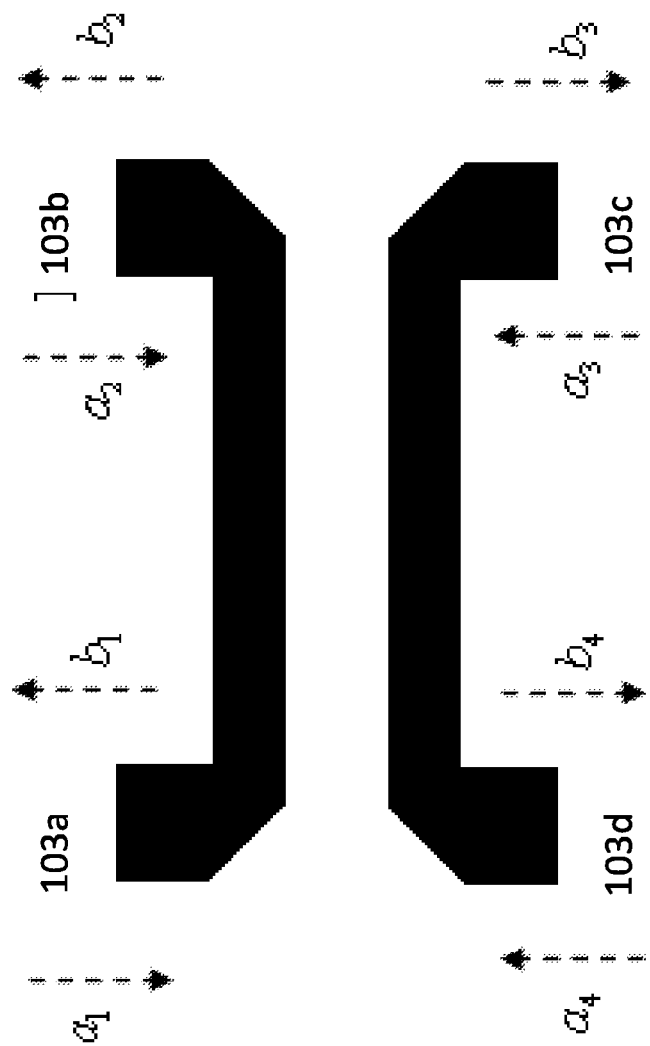
FIG. 2 is the schematic of a directional coupler used in the RFID antenna circuit of FIG. 1.

FIG. 2 show that a typical directional coupler 103 having port 1 103a, port 2 103b, port 3 103c, and port 4 103d.

Port 1 is known as the input port and is connected to a power source. Typically, signal is fed into port 1 from a power amplifier 105.

Port 2 is known as the output port and is connected to the antenna 101. Signal from the directional coupler 103 is transmitted from port 2 to the antenna 101 for broadcast.

Port 3 is known as the isolation port. Basically, the directional coupler 103 allows signals to travel bi-directionally. In one direction, a signal can travel directly from port 1 into port 2 to be broadcasted from the antenna 101 into the surroundings. In a second direction, any signal reflected from an RFID tag in the surroundings which is received by the antenna 101 is fed into port 2 and then coupled into port 3. Accordingly, a receiver 107 is provided at port 3 to receive and process the signal to identify the reflecting RFID tag.

Port 4 is known as the couple port and is terminated in a load resistance of 50-ohm.

Ideally, signal transmission from port 1 to port 2 is one hundred percent. In practice, however, the transmission is less than one hundred percent because, among other losses, some signal from port 1 leaks into port 3. This loss in signal between port 1 and port 2 is known as insertion loss.

Signals reflected by the RFID tags back to the antenna 101 may be quite weak. In order for these reflected signals to be detected, the signal leakage into port 3 from port 1 should be very small or almost inexistent. Unfortunately, the leakage tends to be relatively large, and it overwhelms weaker reflected signals. This causes signal jamming in the directional coupler 103.

Figure 3:
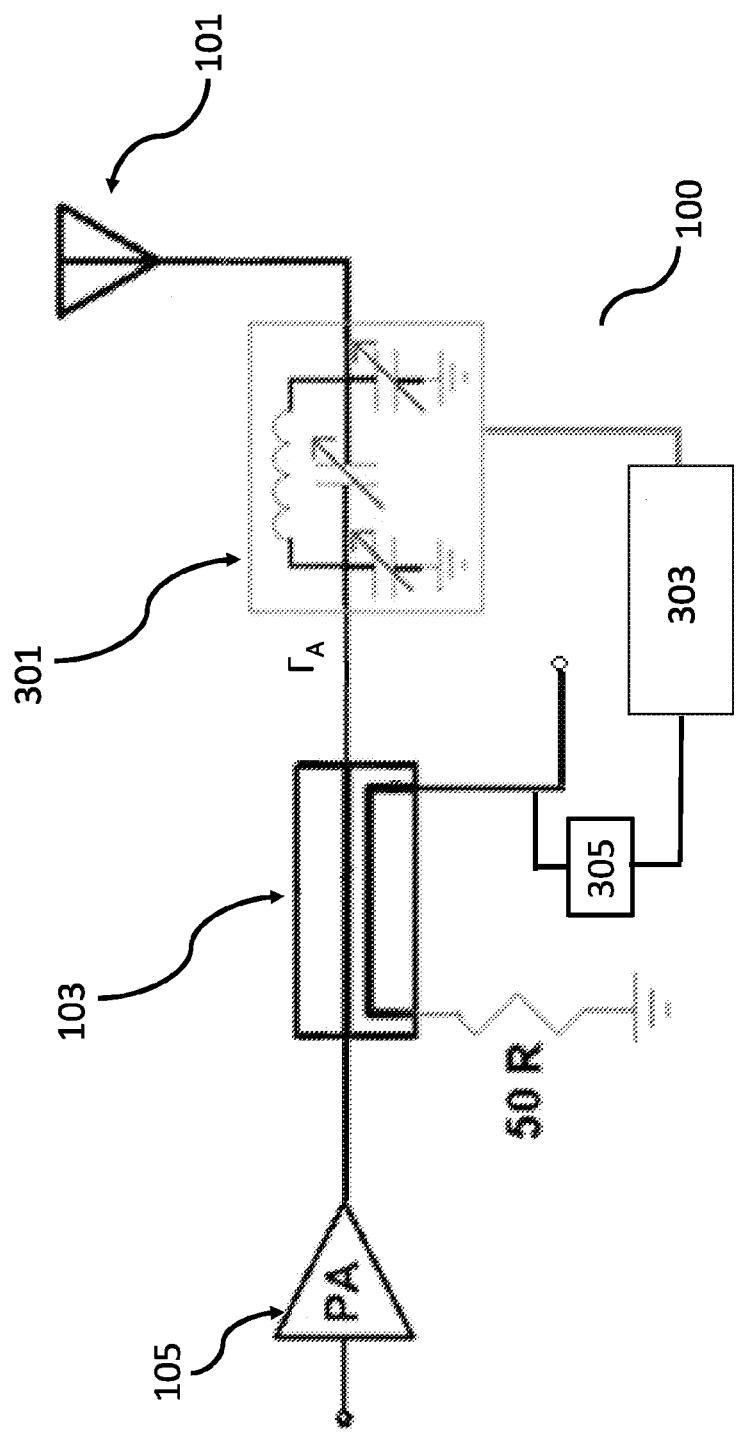
FIG. 3 shows a modification of the RFID antenna circuit of FIG. 1.

FIG. 3 shows the same circuit in FIG. 1 modified to include a first impedance circuit 301 between the port 2 and the antenna 101, and a controller 303 for fine-tuning the variable components in the first impedance circuit 301.

The first impedance circuit 301 is preferably a pi-type circuit, which consists of capacitor and an inductor (LC) in parallel arrangement but placed in series between port 2 and the antenna 101. Two shunted capacitors are placed on either end of the LC.

The first impedance circuit 301 can be tuned to provide a desirable impedance mismatch between port 2 and the antenna 101, such that an incident signal at port 2 going to the antenna 101 is partially reflected and is coupled into port 3. This strategy moves away from the conventional practice of preferring perfect signal transfer from port 2 to the antenna 101. The impedance is set such that the reflected signal has an amplitude and phase which matches that of the leakage from port 1 into port 3 to cancel the leakage. In this way, jamming is possibly reduced or eliminated, to provide maximum transmission and reception signal 'isolation'.

Theoretically, the scattering matrix or S-matrix for an ideal, infinite isolation and perfectly matched, symmetrical directional coupler 103 is given by, $$S = \begin{bmatrix} 0 & \tau & \mu & 0 \\ \tau & 0 & 0 & \mu \\ \mu & 0 & 0 & \tau \\ 0 & \mu & \tau & 0 \end{bmatrix} \quad (1)$$

Such an ideal directional coupler 103 perfectly transmits signal from port 1 to port 2. The zeroes in main diagonal from top left to bottom right represents perfect matching where signal input to any port is not reflected back to that same port. The zeroes on the matrix anti-diagonal represent perfect isolation between port 1 and port 3. However, the perfect isolation represent by the matrix of Equation (1) does not exist due to, among other imperfections, the signal leak into port 3.

The following matrix shows the actual relationship between all the ports in the coupler 103 of the embodiment.

$$\begin{pmatrix} b_1 \\ b_2 \\ b_3 \\ b_4 \end{pmatrix} = \begin{pmatrix} 0 & T & I & C \\ T & 0 & C & I \\ I & C & 0 & T \\ C & I & T & 0 \end{pmatrix} \begin{pmatrix} a_1 \\ a_2 \\ a_3 \\ a_4 \end{pmatrix} \quad (2)$$

Where,
- $a_1$, $a_2$, $a_3$ and $a_4$ are the respective input or reflected signals at ports 1, 2, 3 and 4;
- $b_1$, $b_2$, $b_3$ and $b_4$ are the respective output or incident signals at ports 1, 2, 3 and 4;
- T refers to insertion loss during transmission from port 1 to 2;
- C refers to factor of coupling between port 1 and 4; and
- I refers to isolation representing transmission form port 1 to 3.

I, C, T are complex numbers and their values are provided by the manufacturer of the directional coupler 103.

For completeness, it is mentioned that there is no signal input into port 4 given that port 4 has a resistance of 50-ohm. Therefore, $$a_4 = 0 \quad (3)$$

Given that port 2 is connected to the first impedance circuit 301, incident signal reflected from the first impedance circuit 301 back into port 2 is $$a_2 = \Gamma_A b_2 \quad (4)$$

where
- $\Gamma_A$ is the reflection coefficient between port 2 and the first impedance circuit 301;
- $b_2$ is the output signal at port 2.

The following is the general definition of reflection coefficient for alternating signals:

$$\Gamma = \frac{Z_L - Z_S}{Z_L + Z_S} \quad (5)$$

where
- $Z_S$ is the impedance at source; and
- $Z_L$ is the impedance at load.

Therefore, minimum reflection is obtained when $$Z_S = Z_L \quad (6)$$

Based on this, it can be seen that by providing a suitable mismatch between the impedance at the load and source, the amount of signal reflected can be controlled.

Putting the conditions of Equations (3) and (4) to Equation (2) and simplifying it, the following is obtained:

$$\begin{pmatrix} b_1 \\ b_3 \end{pmatrix} = \begin{pmatrix} T^2 \Gamma_A & I + CT\Gamma_A \\ I + CT\Gamma_A & C^2 \Gamma_A \end{pmatrix} \begin{pmatrix} a_1 \\ a_3 \end{pmatrix} \quad (7)$$

Furthermore, maximum isolation between ports 1 and 3 is also represented as follows.

$$S_{31} = \frac{b_3}{a_1} = 0 \quad (8)$$

Accordingly, the following equation shows the relationship between I, C, T and the reflection coefficient $\Gamma_A$, if there were to be maximum isolation between transmission and reception signals.

$$I + CT\Gamma_A = 0 \quad (9)$$

Turning Equation (9) around, $$\Gamma_A = \frac{-I}{CT} \quad (10)$$

Therefore, as mentioned, if the first impedance circuit 301 is tuned to provide an impedance giving the reflection coefficient $\Gamma_A$, signal transmitting out from port 2 may be partially reflected at a suitable magnitude and phase to cancel out the leakage into port 3.

The setting of this first impedance circuit 301 that can provide the impedance that gives $\Gamma_A$ is saved as the default or initialisation setting in a memory (not shown) accessible to the antenna circuit.

Cancelling signal leakage into port 3 using the first impedance circuit 301 improves detection of signals reflected from RFID tag in the surroundings, and improves transmission and reception signal isolation. At the same time, this allows the required circuitry for the antenna 101 to be small and implementable in handheld devices. Therefore, the antenna 101 can be provided in a mobile telephone, a watch, a notebook computer, a computer tablet such as the iPad™ and so on. Accordingly, these portable devices may now be used detect objects tagged with RFID in the premises of any retailer or warehouse. For example, a user may use his mobile telephone to downloaded applications from different retailers, the applications each containing a library of objects or locations provided by the retailers which are tagged with RFID tags. The mobile telephone may then invoke a suitable software to use the RFID antenna to locate objects in the premises of the retailer. Other things can be searched for using RFID, such as restaurants within a building, books in a library or even persons working in a large premise such as a security guards.

In use, when the impedance at the antenna 101 changes due to external factors such as user's body effect, the impedance at the output of port 2 changes, which in turn changes the extent of signal reflected at port 2. In this way, the power leakage into port 3 will no longer be fully cancelled by the amount of transmission signal reflected by the first impedance circuit 301 into port 2. As a result, the first impedance circuit 301 has to be fine-tuned to re-optimise cancellation of the leakage signals in port 3.

In general, the power leaked into port 3 will have a very high magnitude compared to the magnitude of signals reflected from an RFID tag in the surroundings and received by the antenna 101. For example, the power leakage can be as high as −20 dB while the reflected RFID signal can be as low as −40 dB. For this purpose, a power detector 305 is provided at port 3 to monitor the power leakage into port 3. If the power detected at port 3 by the power detector 305 is much lower than −20 dB or very near to this estimate of −40 dB, it is assumed that isolation of the received signal from the transmission is optimised. On the other hand, if the power detector detects a power higher than this estimation of −40 dB, the controller 303 will assume that there is significant amount of un-cancelled leakage from port 1 into port 3.

If it is deemed that there is significant amount of un-cancelled leakage from port 1 into port 3, the controller 303 then fine-tunes the impedance circuit 301 to change the impedance in first impedance circuit 301 until the power leakage into port 3 is no longer detected or has minimised.

The adjusted impedance achieved in fine-tuning is not based on theoretical calculation but based on the controller 303 reacting to feedback from the power detector 305. Nevertheless, the fine-tuning starts from the initialisation setting of the impedance circuit 301 calculated to provide $\Gamma_A$ theoretically. This is because the adjusted impedance is unlikely to deviate too much from the impedance calculated to provide $\Gamma_A$. Accordingly, there is no need to sweep through the entire possible impedance range in the first impedance circuit to find the optimal level of impedance leading to complete cancellation of the leakage signal.

In practice, the controller 303 may fine-tune the impedance of the first impedance circuit 301 incrementally or decrementally, as the case may require, until the leakage is detected to have been reduced to an acceptable level or to an undetectable level.

Figure 4:
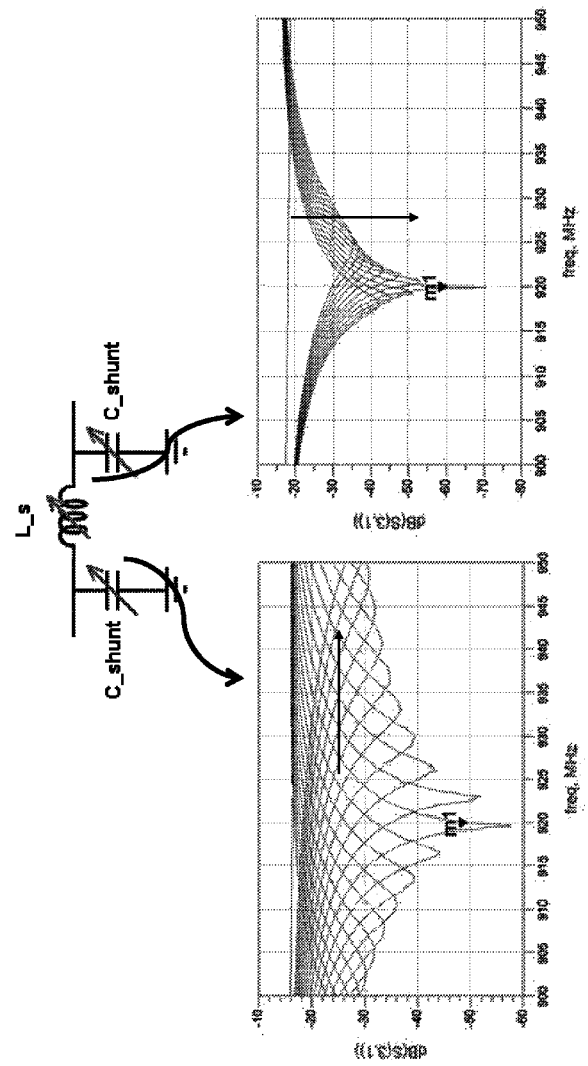
FIG. 4 shows how the modification of FIG. 3 affects signal isolation between transmit path and receive path of the RFID antenna circuit of FIG. 2.

FIG. 4 shows the effects of another impedance circuit which is similar to that of the afore-described impedance circuit 301. The impedance circuit in FIG. 4 is also a pi-type circuit but there is no capacitor in parallel to the inductor. FIG. 4 shows how, where an impedance circuit is a pi-type tunable circuit, tuning the shunt capacitors tunes the resonance of isolation between the transmit path and receive path. Tuning the inductor tunes the attenuation magnitude of isolation between the transmit path and receive path.

Figure 5:
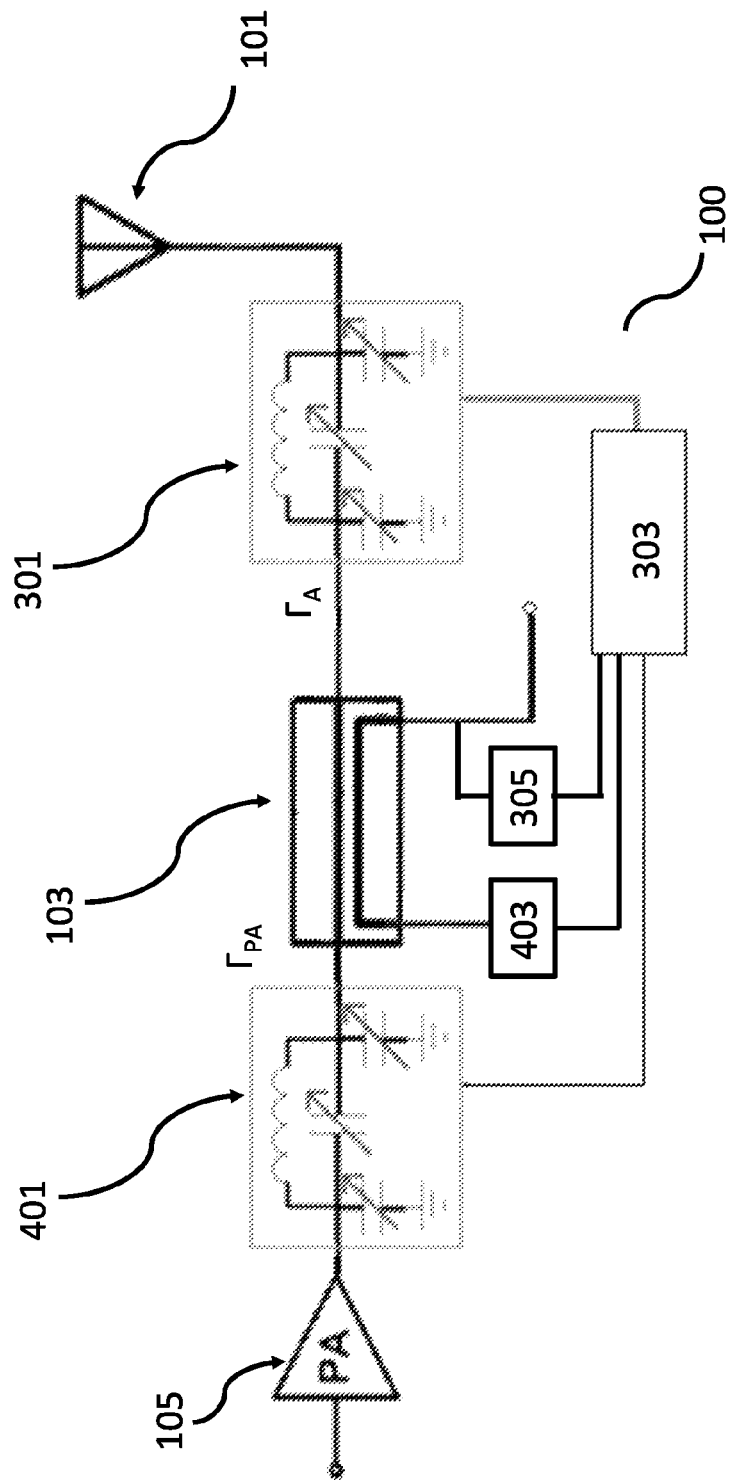
FIG. 5 shows a further modification of the RFID antenna circuit of FIG. 1.

FIG. 5 shows a variation of the embodiment comprising a second impedance circuit 401 between the power amplifier 105 and port 1. Based on Equation (5), it is known that reactance in a load and the reactance in a source must be equal but in the opposite signs for maximum power transfer.

$$Z_S = Z_L^* \quad (11)$$

Accordingly, for maximum transmission of power from the power amplifier 105 to port 1, the impedance of the power amplifier 105 should match that of port 1 but in the opposite phase. Accordingly, the second impedance circuit 401 is provided between the power amplifier 105 and port 1, to adjust the total impedance load feeding into port 1.

The second input circuit 401 is tuned to an initialisation or default impedance obtained by calculation based on I, T and C of the coupler 103. The initial impedance should match the impedance at port 1 to provide the following reflection coefficient at the connection to port 1.

$$\Gamma_{PA} = \left(\frac{-IT}{C}\right)^* \quad (12)$$

The relationship between $\Gamma_{PA}$ and $\Gamma_A$ is as follows $$\Gamma_{PA} = (T^2 \Gamma_A)^* \quad (13)$$

Furthermore, the relationship between the incident and reflected signals at port 1 is as follows for perfect signal transmission into port 1.

$$\Gamma_{PA}^* = S_{11} = \frac{b_1}{a_1} \quad (14)$$

Therefore, $\Gamma_{PA}$ directs that the initial setting of the variable components in the second impedance circuit 401. This initial setting is saved as the default or initialisation setting in a memory (not shown) accessible to the antenna circuit.

During use, impedance change at the antenna 101 due to external factors such as body effect causes the entire impedance load at port 2 to change too. As a result, the impedance at port 1 will also change and no longer match the impedance at the second impedance circuit 401. This reduces the efficiency of power transmission into port 1.

A further power detector 403 is provided to monitor power at port 4. This is because the power at port 1 may be detected by monitoring port 4. Also, this further power detector 403 is not connected to port 1 because the power detector 403 may affect the impedance at port 1.

The power fed into port 1 is considered optimal if the power in port 4 is the same or almost the same as the amount of power output by the power amplifier 105. The amount of power output by the power amplifier 105 may be made known to the controller, such as by being stored as a value in the memory (not shown). The controller may then be able to detect whether the power in port 4 is substantially below this value. If the further power detector 403 detects a change in power at port 4 or that the power at port 4 is not optimal, the controller 303 is triggered to fine-tune the second impedance circuit 401 to re-maximize power transmission from the output of the second impedance circuit 401 to the input of port 1. In alternative embodiments, the power detector 403 can monitor both the power output of the power amplifier 105 and the power at port 4, and use their relative difference as an indication of how much to adjust the second impedance circuit 401.

The controller 303 may fine-tune the impedance of the second impedance circuit 401 incrementally or decrementally, as the case may require, until the power detected in port 4 is detected deemed optimised. This fine-tuning is not based on computation but on reacting to power detected in port 4 and is, in effect, a re-matching of the impedance of the impedance circuit 401 to the changed impedance of port 1.

Re-optimisation of the power transmission into port 1 is likely to be achieved at a new impedance which is near the initialisation impedance of the second impedance circuit 401. Therefore, fine-tuning the second impedance circuit 401 starting from the initialisation impedance relieves the need of sweeping through an entire range of impedance.

In reality, the inherent impedance of the power amplifier 105 will add to the impedance of the second impedance circuit 401 obtained by theoretical calculation. As a result, the combined impedance of the power amplifier 105 and the second impedance circuit 401 will cause the actual reflection coefficient at the feed into the input port to deviate slightly from the theoretical $\Gamma_{PA}$. However, this deviation is trivial, as the fine-tuning is performance based. By monitoring and optimising the power detected at port 4, the inherent impedance of the power amplifier 105 will be 'tuned away' when the controller fine-tunes the second impedance circuit 401 starting from the initialisation impedance.

In practice, using the second impedance circuit 401 to match the output impedance of the power amplifier to the input impedance of port 1 is the same as maximizing the power transmission from the power amplifier 105 to the antenna, as the power amplifier and the second tuning circuit 401 may be seen as a single and whole impedance load. However, for clarity, it may be described in some situations that the optimisation of signal transmission is from the output of the second impedance circuit 401 to the input of port 1, rather than from the power amplifier 105 to port 1.

Therefore, the embodiment as described so far comprises a first impedance circuit 301 to provide a first initialisation impedance at port 2 to allow a certain amount of signal reflection to cancel the leakage signal in port 3. Furthermore, to optimise signal transmission from a power supply into port 1, the second impedance circuit 401 provides a second initialisation impedance to match the impedance at port 1. The first and second initialisation impedance were obtained theoretically, by calculation based on the I, C and T characteristics of the directional coupler 103. Fine-tuning the impedance of either the first impedance circuit 301 or the second impedance circuit 401 starting from the initialisation impedance achieves re-optimisation quickly.

Figure 6:
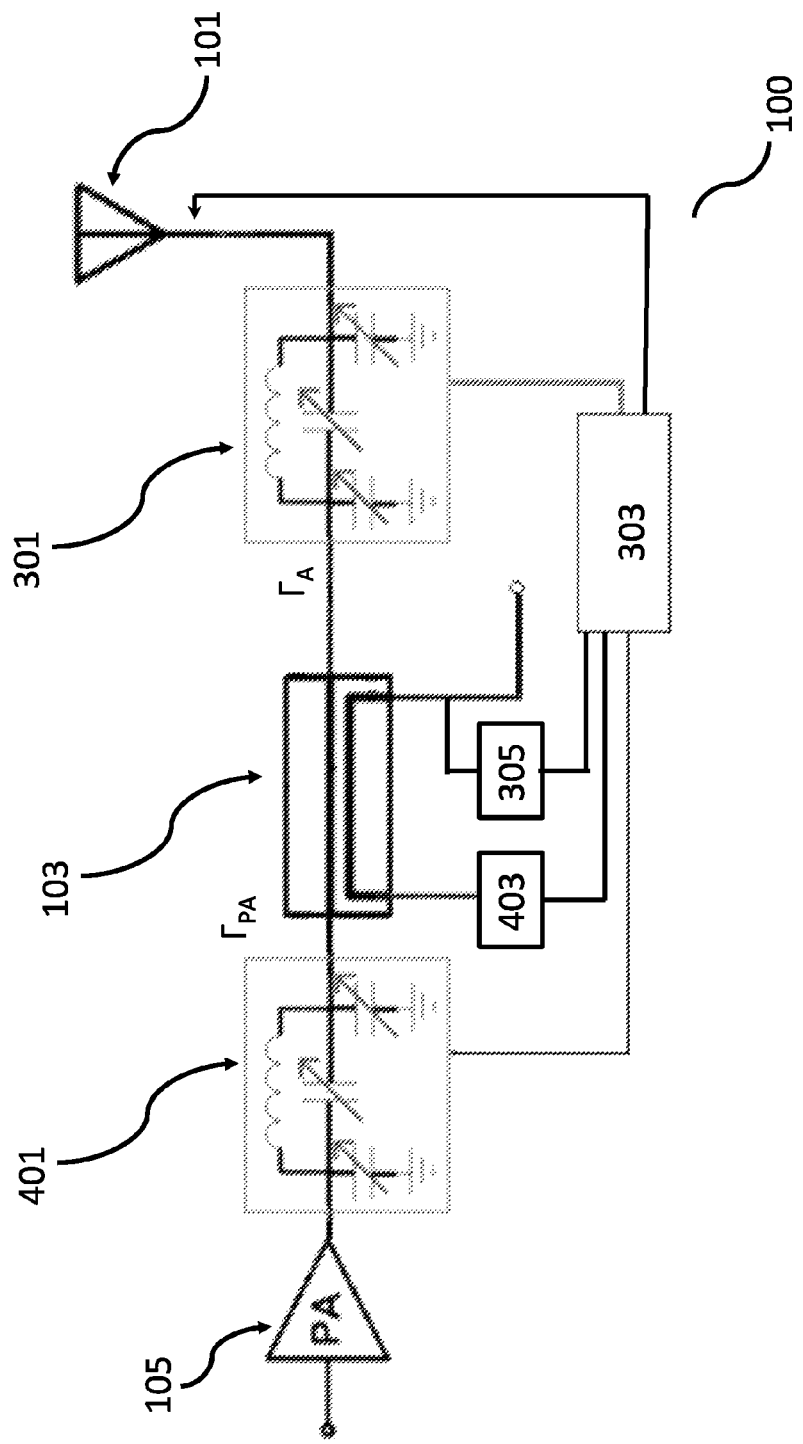
FIG. 6 shows yet a further modification of the RFID antenna circuit of FIG. 1.
Figure 7:
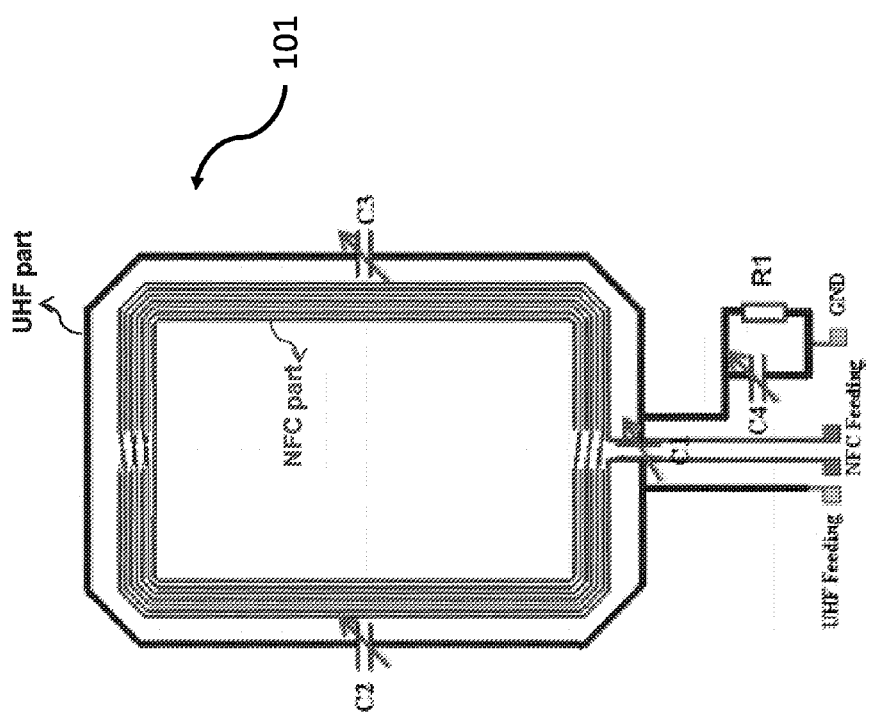
FIG. 7 shows an antenna used in the antenna circuit of FIG. 6.

FIG. 6 shows yet a further variation of the embodiment in which the actual antenna 101 itself is tunable. FIG. 7 is a schematic illustration of such a tunable antenna 101 coil having capacitors c1, c2, c3 and c4. These capacitors are variously tunable to adjust the antenna load or impedance.

To determine the initialisation values for these capacitors such that the antenna 101 has optimal reception and transmission, signal reception of a handheld device installed with the antenna 101 is optimised in free space. Being in free space means that the handheld device is placed where there is no object in proximity which interferes with or blocks signals transmission and reception. The capacitors of the antenna 101 are tuned until the power detectors 305, 403 detect maximum signal transmission and reception, and the values of the capacitors are stored in a memory (not shown) in the handheld device as default or initialisation capacitor values.

The steps of optimising a handheld device containing the antenna circuit 100 at factory is performed in the following order. The process starts firstly with calculating $\Gamma_A$ and $\Gamma_{PA}$. Subsequently, the impedance circuit 301 and the second impedance circuit 401 are tuned to provide $\Gamma_A$ at the output of port 2 and $\Gamma_{PA}$ at the input to port 1. When the impedance circuits 301, 401 have been tuned, the antenna 101 itself is then optimised in free space. The values of all the variable components in the impedance circuit 301, the second impedance circuit 401 and the antenna 101 obtained so far are then stored as default values in a memory accessible by the handheld device, such as a memory installed inside the handheld device. When the handheld device is in use and the antenna's component's tuning has shifted or the antenna's impedance has changed due to a change in the immediate surroundings, the amount of power at port 4 may be detected to be less than optimum or an amount of un-cancelled leakage may be detected at port 3. To return the antenna circuit 100 to optimum performance, the controller 303 re-sets the variable components in the antenna 101 first to their default values to re-optimise signal reception at the antenna 101. The re-optimisation of the antenna is the relative 'coarse-tuning'. Subsequently, the controller 303 proceeds with fine-tuning of the antenna circuit 100, that is, the controller 303 tunes the second impedance circuit 401 starting from the initialisation value providing the impedance which gives $\Gamma_{PA}$. When the power detected in port 4 is deemed re-optimised, the controller 303 then tunes the first impedance circuit 301 starting from the initialisation value providing the impedance which gives $\Gamma_A$. When the leakage signal detected in port 3 is deemed completely or sufficiently cancelled, the re-optimisation process is finished. Since the re-tuning of the antenna, the second impedance circuit and the first impedance circuit start from their respective initialisation settings, the antenna circuit 100 can be quickly re-optimised despite external load that changes the impedance of the antenna 101.

In a further variation of the embodiment, various sets of default or initial values for the variable components in the antenna 101 are determined in factory. In addition to free space, the variable components in the antenna 101 are optimised in different common situations, such as when the handheld device containing the antenna 101 is facing a desk, or being cradled in a person's hand, or being held with a user's fingers only. For each of these situations, the optimum values for the variable components in the antenna 101 are stored in a lookup table. An example of a lookup table is provided as FIG. 8.

When the handheld device is in use, and the controller 303 detects that the antenna circuit 100 performance is not optimal, the controller 303 firstly 'jump-tunes' the variable components in the antenna 101 by applying, in turn, the set of initial variable component values each of the different situations in the lookup table. The set of initial settings for the tunable antenna 101 which gives the strongest readings at power detectors 305 is selected and maintained as the current tuning in the antenna 101's variable components. Preferably, there is no fine-tuning or adjustment of the variable components in the antenna 101, to save time. Further optimisation is done by fine-tuning the second impedance circuit 401 and then fine-tuning the first impedance circuit 301. In this way, the handheld device may be quickly optimised for different physical situations affect antenna 101 reception, and affecting signal transmission and signal isolation in the directional coupler 103.

Figure 9:
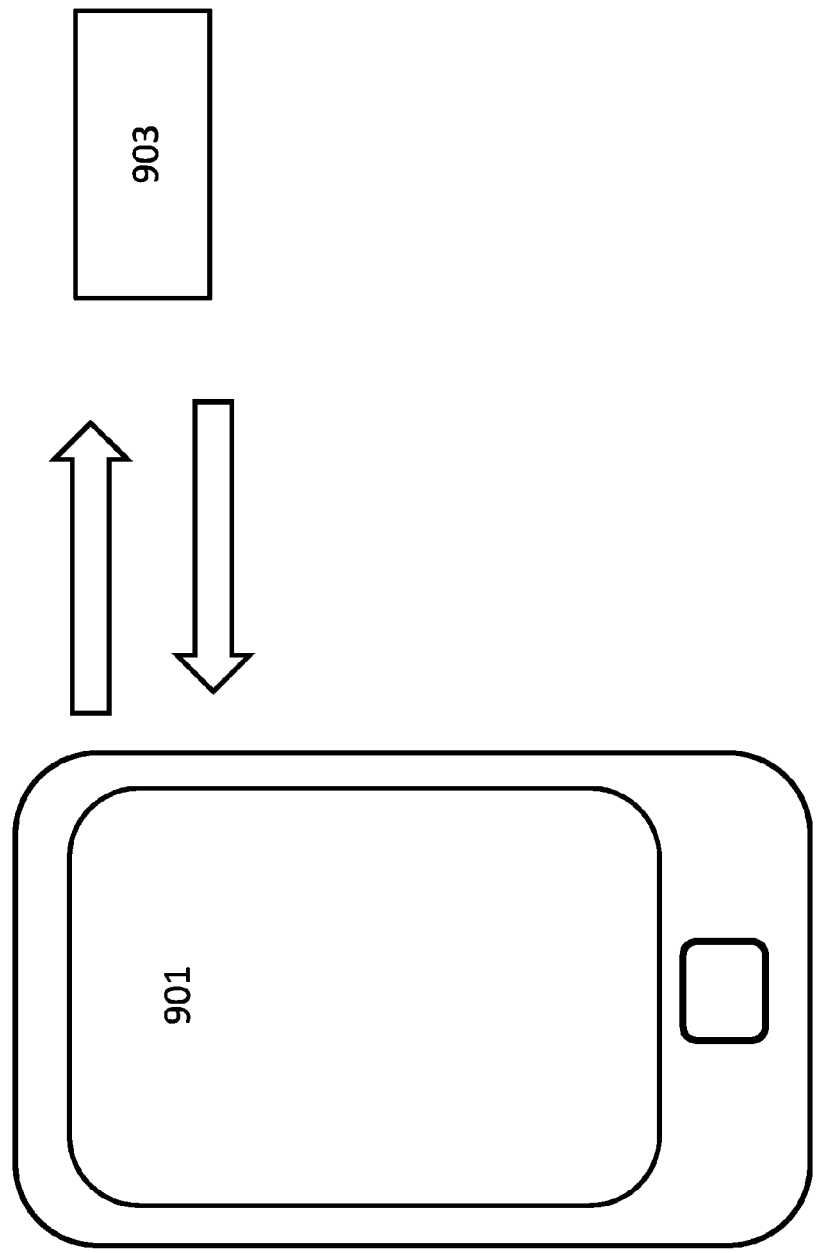
FIG. 9 illustrates a mobile telephone which can contain the antenna of FIG. 3, 5 or 6.

FIG. 9 is an illustration of a mobile telephone 901 in communication with an RFID tag 903. The described antenna circuit 100 if installed in such a mobile telephone is unlikely to require much space and also unlikely to modify the external appearance of the mobile telephone while providing sufficiently strong or sensitive RFID signal reception.

Figure 10:
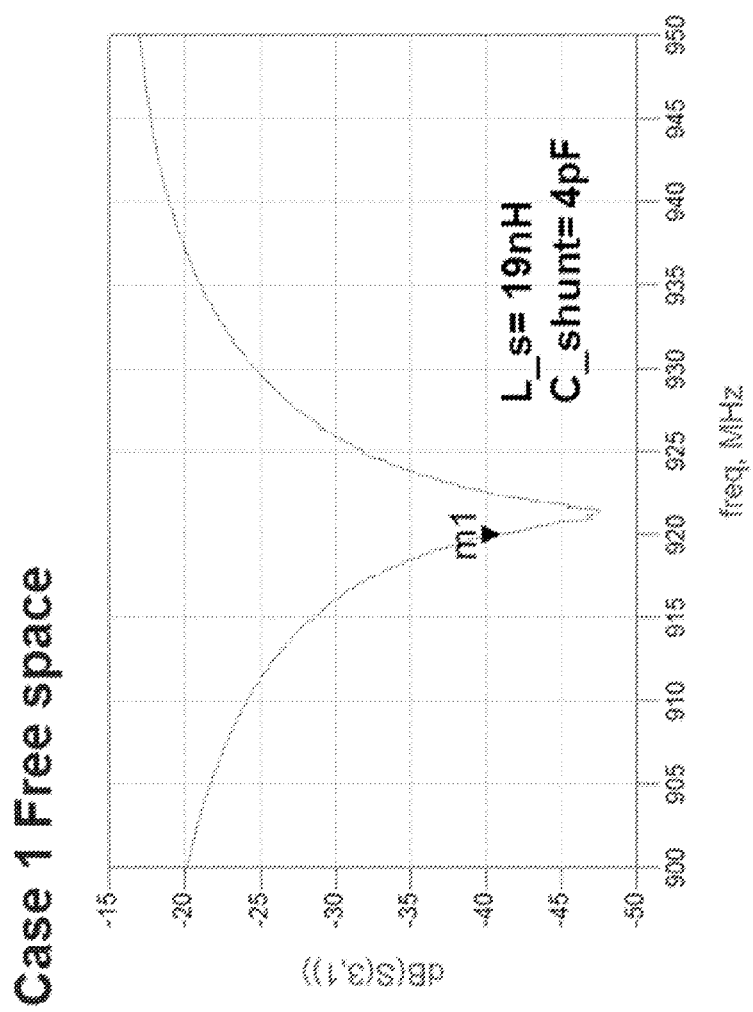
FIG. 10 shows the effect of tuning variable components in the RFID antenna circuit of FIG. 3.

FIGS. 10 to 13 illustrate that isolation between the transmission and reception paths below −40 dB in free space can be achieved. In FIG. 10, the inductor in the impedance circuit 301 is tuned to 19 nH and the capacitors to 4 pF. 'm1' in FIGS. 10 to 13 is the operating frequency of RFID reader.

Figure 11:
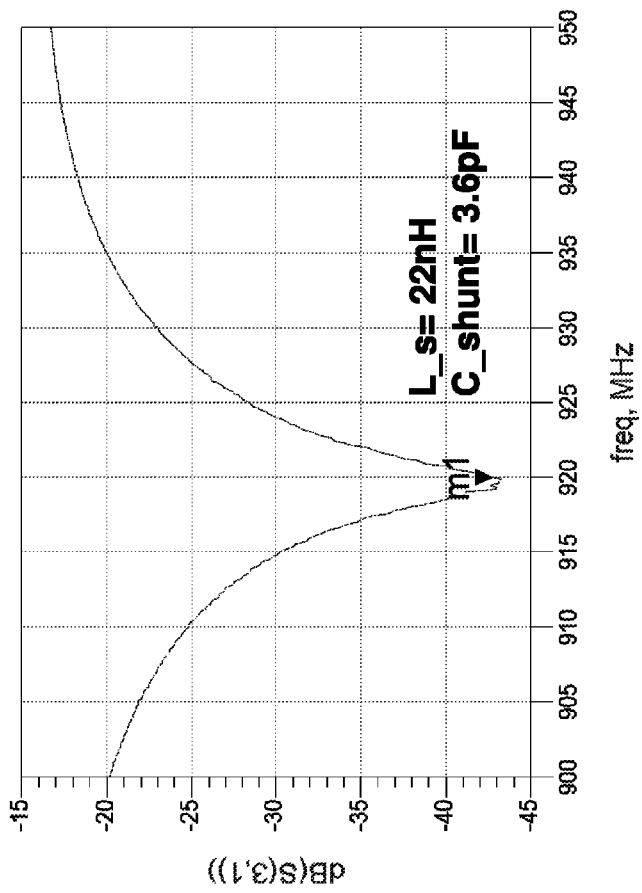
FIG. 11 shows another effect of tuning variable components in the RFID antenna circuit of FIG. 3.

FIG. 11 shows isolation between the transmission and reception paths for a handheld device placed behind a desk. The inductor is tuned to 22 nH and the capacitors to 3.6 pF.

Figure 12:
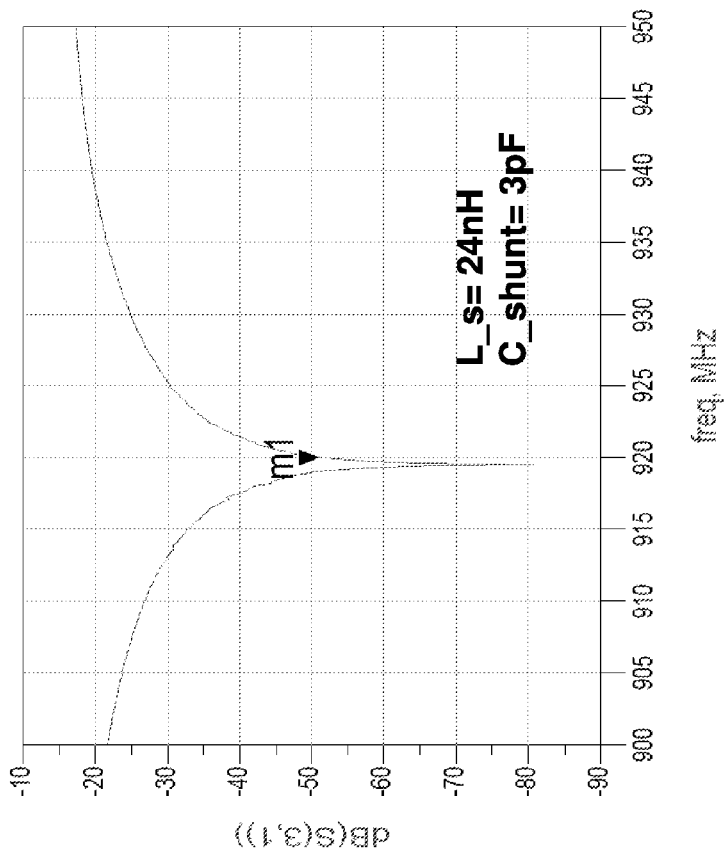
FIG. 12 shows yet a further effect of tuning variable components in the RFID antenna circuit of FIG. 3.

FIG. 12 shows isolation between the transmission and reception paths for a handheld device held in a hand. The inductor is tuned to 24 nH and the capacitors to 3 pF.

Figure 13:
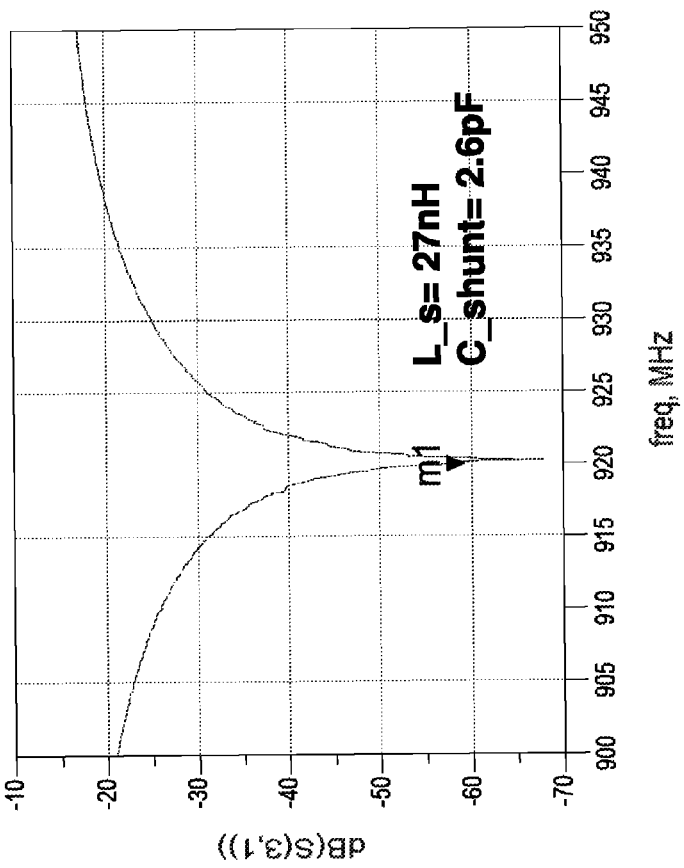
FIG. 13 shows yet a further effect of tuning variable components in the RFID antenna circuit of FIG. 3.

FIG. 13 shows isolation between the transmission and reception paths for a handheld device held with fingers. In the impedance circuit 301, the inductor is tuned to 27 nH and the capacitors to 2.6 pF.

Accordingly, an antenna circuit 100 has been described which comprise a directional coupler 103 having an input port 103a, a output port 103b and an isolation port 103c, an antenna 101, a first impedance circuit 301 connecting the output port 103b, wherein the first impedance circuit is suitable for providing an impedance to reflect signal output from the output port 103b back to the output port 103b. Furthermore, the reflected signal is capable of cancelling signal leaking from the input port 103a into the isolation port 103c.

Furthermore, the antenna circuit 100 has been described to comprise a second impedance circuit 401; the second impedance circuit 401 connecting a power source 105 and the input port 103a; the second impedance circuit 401 suitable for providing an impedance for optimising power transmission from a power supply to the input port 103a.

Furthermore, a method of optimising an antenna circuit 100 has been described, comprising the steps of: providing a directional coupler 103 suitable for transmitting into an antenna 101, the directional coupler 103 having an input port 103a, output port 103b and isolation port 103c, and the isolation port 103c having a signal leakage from the input port 103a; setting an initialisation impedance at the output port 103b to reflect a portion of signal output at the output port 103b into the isolation port 103c to cancel the signal leakage. Preferably, the method further comprises setting an initialisation impedance at the input port 103a of the directional coupler 103 to optimise power transfer from a power supply 105 output port to the input port 103a. Preferably, the antenna 101 is a tunable antenna, and the method further comprises a step of setting an initialisation value in at least one tunable components in the tunable antenna 101.

By the terminology of "antenna circuit", the skilled reader knows it does not refer only to a very antenna itself but include accompany circuitry for improving, modifying or controlling transmission and reception of signals to and from the antenna.

In simpler embodiments, the first impedance circuit 301 may be replaced with just any circuit providing a suitable impedance that is set based on the signal leakage characteristics into the isolation port. The circuit can be a non-tunable providing a fixed impedance. In such cases, it may also not be necessary that the signal leakage into the isolation port is one hundred percent or completely cancelled, as long as some of the leakage signal is cancelled to improve the isolation of the received signal in the isolation port. Similarly, the second impedance circuit 401 may be replaced with just any circuit providing a suitable impedance that is set to improve signal transmission from a power supply to the input port, based on characteristics of the directional coupler. The circuit can be a non-tunable providing a fixed impedance. In such cases, it may also not be necessary that the signal transmission from the input port to the isolation port is one hundred percent, as long as the transmission has been improved.

A memory (not shown) has been described to be in the antenna circuit. Provision of such a memory is conventional in the art and the skilled man understands that the memory can be in an EEPROM, removable memory stick or even a remotely located memory accessible wireless or remotely. However, in some cases, it is also possible that the components are physically pre-set to the initialisation settings such as by switches, flags and so on.

Although a power amplifier is described providing power to port 1 or the input port 103a, it is possible that a power supply from a source other than a power amplifier may be provided, such as one from a transistor or a source of power. In some instances, the antenna circuit may be made and sold in its entirety without the power amplifier 105 and it is up to a user to connect port 1 to a power amplifier 105 himself.

Figure 14:
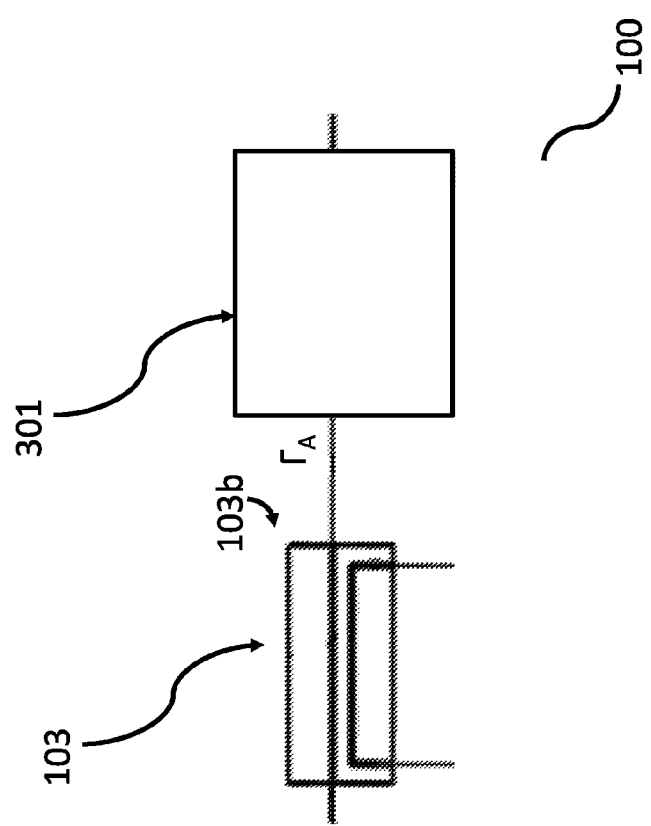
FIG. 14 shows a variation of the RFID antenna circuit of FIG. 5.
Figure 15:
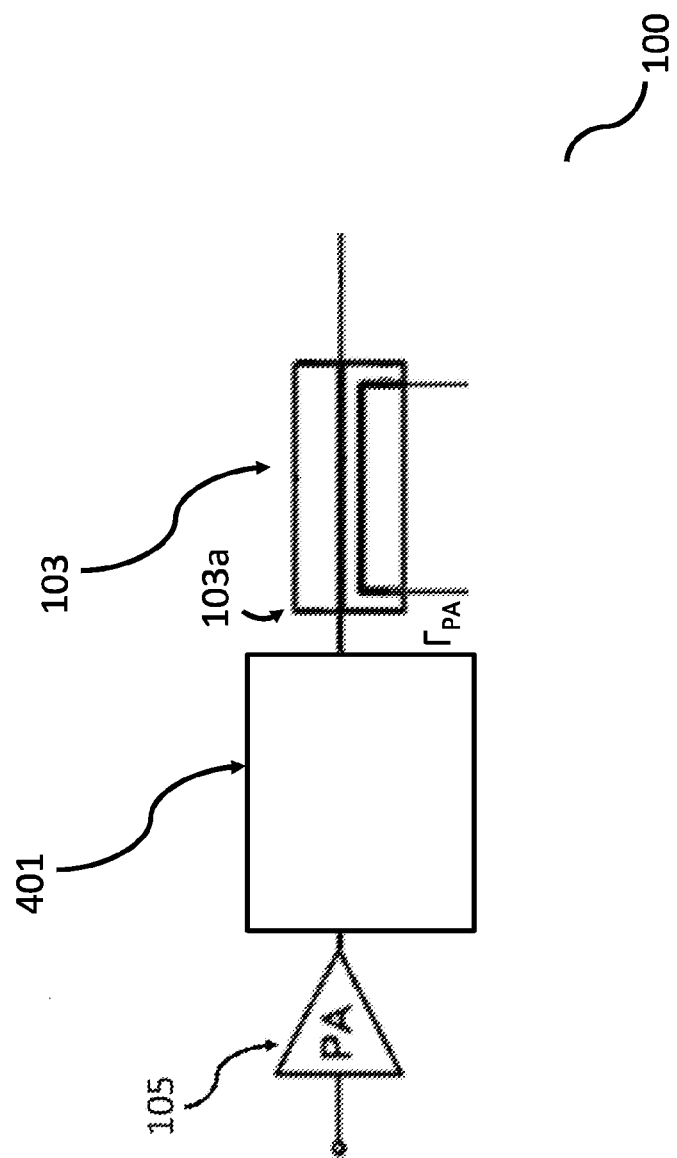
FIG. 15 shows a further variation of the RFID antenna circuit of FIG. 5.

The skilled man knows that various independent parts of the described embodiments represent features which may be provided, sold and claimed independently. An example is shown in FIG. 14 of a directional coupler 103, the output port 103b of which is connected to a possibly non-tunable circuit 301 tuned and fixed to provide an impedance to provide $\Gamma_A$, and which has no processor, no antenna connected to the impedance circuit 301, and also no impedance circuit 401 at the input port 103a of the directional coupler 103. Another example is shown in FIG. 15 of a directional coupler 103 the output port 103b of which is not connected to any impedance circuit 301, and which also has no processor, no antenna, and has only a power amplifier 105 or the like, and a circuit 401 at the input port 103a of the directional coupler 103 tuned and fixed to provide an impedance to provide $\Gamma_{PA}$ between the power amplifier 105 and the input port 103a.

The skilled man will also understand that the controller may be a micro-controller, a processor or even a remote computing device for controlling the antenna circuit. Preferably, the same controller in the handheld device containing the antenna is used so that there is no need for dual processors.

The controller is programmed to tune the first impedance circuit and second impedance circuit, as well as the antenna. By 'programmed', the skilled reader understands that the controller may run on a computer program, a software, a firmware or any microcontroller program for directing the controller to perform tasks.

Exemplary embodiments of the present invention are thus described. Although the description referred to particular embodiments, it will be clear to one skilled in the art that the present invention may be practiced with variation of these specific details. Hence this invention should not be construed as limited to the embodiments set forth herein.

Figure 16:
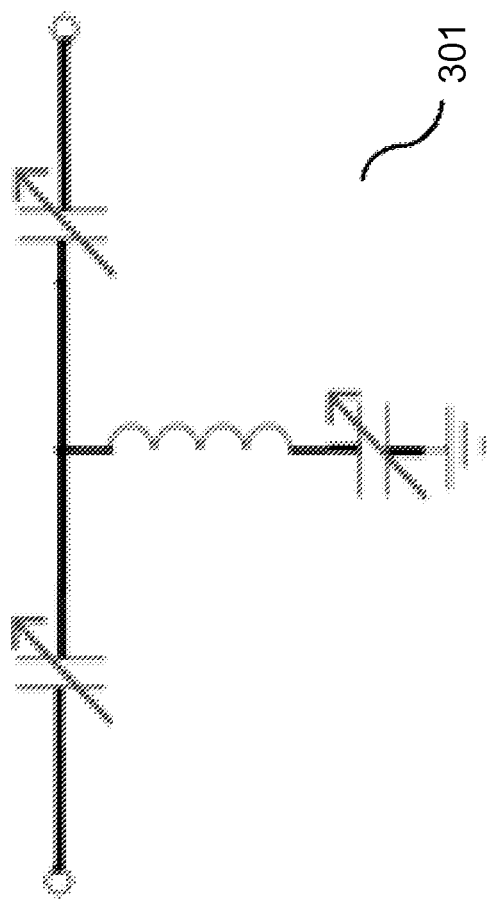
FIG. 16 shows a variation of an impedance circuit useable in the RFID antenna circuit of FIG. 3.
Figure 17:
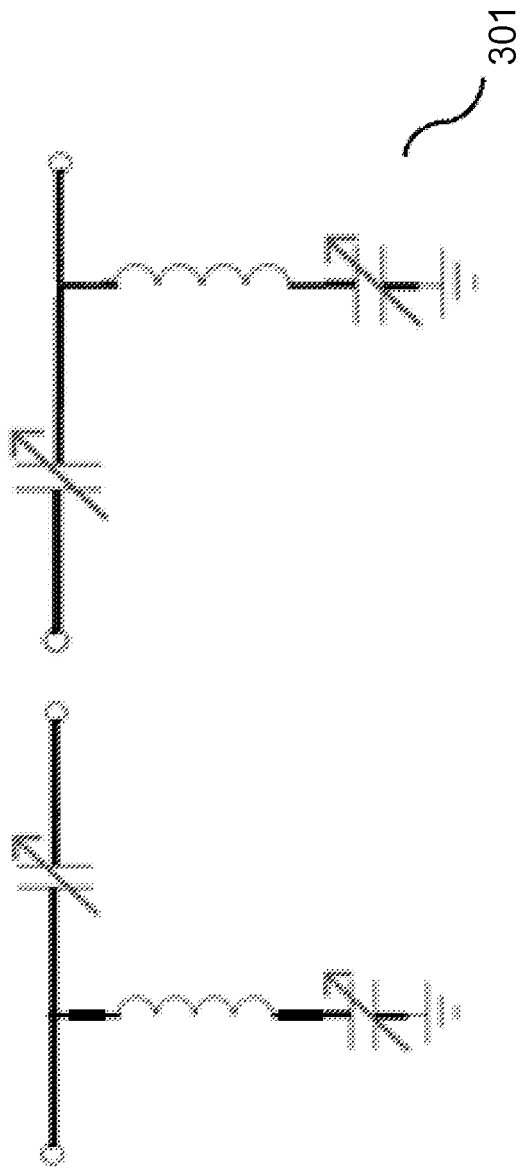
FIG. 17 shows a variation of an impedance circuit useable in the RFID antenna circuit of FIG. 3.

For example, the pi-type circuit described for the impedance circuit 301 and the second impedance circuit 301 is only one of the many types of impedance circuit 301 which can be used. FIG. 16 shows a T-type impedance circuit 301 and FIG. 17 shows two L-type impedance circuit 301 which may be used instead. The skilled reader will understand that the variable components in the impedance circuit 301 can be fine-tuned by the controller 303 and the suitable calculations are made for providing the desired impedance in these circuits.

Although the description mainly describe use of the antenna in RFID, it is possible that the same invention and the advantages thereof may be applied to antennae for uses other than RFID.

The antenna 101 and the first impedance circuit 301 can be considered in some instances as a single 'antenna black box'. In this instance, although the first impedance circuit 301 has been described as a separately identifiable circuit from the antenna 101, the skilled man knows that any integral tunable antenna in which the antenna impedance may be tuned to provide an overall impedance to provide signal reflection into port 2 is included as possible embodiments.

What is claimed is:

1. A method of optimising an antenna circuit, comprising:
providing a directional coupler having an input port, an output port that transmits a signal to an antenna, and an isolation port; and
providing a first impedance load at the output port of the directional coupler that has a mismatched impedance to the output port to reflect at least a portion of the signal back into the output port to substantively cancel a leakage signal that leaks from the input port into the isolation port.

2. The method of optimising the antenna circuit of claim 1, further comprising:
providing a second impedance load having an impedance to substantively match an impedance of the input port.

3. The method of optimising the antenna circuit of claim 2, wherein the second impedance load is tunable and has a second initialisation impedance, further comprising:
tuning an impedance of the second impedance load from the second initialisation impedance to substantively match a change in the impedance of the input port.

4. The method of optimising the antenna circuit of claim 3, wherein the second initialisation impedance is determined from characteristics of the directional coupler to provide a reflection coefficient that is:

$$\Gamma_{PA} = \left(\frac{-IT}{C}\right)^*$$

where * means conjugate; and
$\Gamma_{PA}$ is the reflection coefficient that is between the input port and the second impedance load.

5. The method of optimising the antenna circuit of claim 1, wherein the first impedance load is tunable and has a first initialisation impedance, further comprising:

tuning an impedance of the first impedance load from the first initialisation impedance to cancel the leakage signal that is un-cancelled at the first initialisation impedance.

6. The method of optimising the antenna circuit of claim 5, wherein
the first initialisation impedance is determined from characteristics of the directional coupler to provide a reflection coefficient that is:

$$\Gamma_A = \frac{-I}{CT}$$

where,
$\Gamma_A$ is the reflection coefficient between the output port and the first impedance circuit;
T refers to insertion loss from the input port to the output port;
C refers to a coupling factor between the input port and a couple port;
I refers to an isolation factor between the input port and the isolation port.

7. The method of optimising the antenna circuit of claim 1, wherein the antenna is a tunable antenna, further comprising:
setting an initialisation value in a tunable component in the tunable antenna.

8. The method of optimising the antenna circuit of claim 7, further comprising:
selecting, from a plurality of pre-determined initialisation values, the initialisation value to set the tunable component in the tunable antenna.

9. An antenna circuit, comprising:
a directional coupler having an input port, an isolation port, and an output port that transmits a signal;
a first impedance circuit that connects to the output port of the directional coupler and to an antenna;
wherein the impedance circuit is tunable to mismatch an impedance of the output port and an impedance of the antenna;
the first impedance circuit having an initialisation tuning that has a first initialisation impedance that reflects the signal back to the output port of the directional coupler to substantively cancel a leakage signal that leaks from the input port into the isolation port of the directional coupler;
wherein the first initialisation impedance is set at a value to achieve a reflection coefficient between the output port of the directional coupler and the first impedance circuit of:

$$\Gamma_A = \frac{-I}{CT}$$

where,
$\Gamma_A$ is the reflection coefficient between the output port and the first impedance circuit;
T refers to insertion loss from the input port to the output port;
C refers to a coupling factor between the input port and a couple port; and
I refers to an isolation factor between the input port and the isolation port;
wherein the first impedance circuit is tuned from the initialisation tuning, by selecting and applying a set of optimal values, to adjust an impedance to substantively cancel the leakage signal that is un-cancelled at the first initialisation impedance, wherein the set of optimal values for the first impedance circuit are pre-determined.

10. The antenna circuit of claim 9 further comprising:
a second impedance circuit that connects to the input port of the directional coupler and a power supply output port;
the second impedance circuit being tunable and having a second initialisation tuning that has a second initialisation impedance to substantively match an impedance of the input port;
wherein the second impedance circuit is tunable from the second initialisation tuning to adjust an impedance to substantively match a change in the impedance of the input port.

11. The antenna circuit claim 10, wherein the second initialisation impedance is determined from characteristics of the directional coupler to provide a reflection coefficient that is:

$$\Gamma_{PA} = \left(\frac{-IT}{C}\right)^*$$

where * means conjugate; and
$\Gamma_{PA}$ is the reflection coefficient that is between the input port and the second impedance circuit.

12. The antenna circuit of claim 10 further comprising:
a controller that tunes the second impedance circuit starting from the second initialisation tuning to optimally match a change in the impedance of the input port.

13. The antenna circuit of claim 9 further comprising:
a controller that tunes the first impedance circuit starting from the first initialisation tuning to optimise cancellation of the leakage signal that is un-cancelled at the first initialisation impedance.

14. The antenna circuit of claim 9, wherein the antenna is tunable.

15. The antenna circuit of claim 9, further comprising:
a memory that stores at least one set of pre-determined optimisation settings that optimize the antenna.

16. A handheld communication device, comprising:
a radio-frequency identification (RFID) antenna circuit having a directional coupler that includes an input port, an output port that transmits a signal, and an isolation port; and
an impedance load connected to the output port, wherein
wherein the impedance load has a mismatched impedance to the output port of the directional coupler that reflects the signal back to the output port to substantively cancel a leakage signal that leaks from the input port into the isolation port.

17. The handheld communication device of claim 16, wherein the impedance load is tunable and has an initialisation impedance that reflects the signal back to the output port to substantively cancel the leakage signal;
the impedance load being tunable from the initialisation impedance to substantively cancel the leakage signal that is un-cancelled at the first initialisation impedance.

18. A directional coupler circuit, comprising:
a directional coupler having an input port, an output port that transmits a signal and an isolation port; and
an impedance load connected to the output port,
wherein the impedance load has a mismatched impedance to the output port of the directional coupler that reflects the signal back to the output port to substantively cancel a leakage signal that leaks from the input port into the isolation port.

19. The directional coupler circuit as claimed in claim 18, wherein the impedance load is tunable to adjust the impedance from an initialisation impedance to cancel the leakage signal that is un-cancelled at the initialisation impedance.

* * * * *